United States Patent
Lee et al.

(10) Patent No.: US 9,721,943 B2
(45) Date of Patent: Aug. 1, 2017

(54) WIRING STRUCTURE AND ELECTRONIC DEVICE INCLUDING THE SAME

(71) Applicant: Samsung Electronics Co., Ltd., Suwon-si, Gyeonggi-do (KR)

(72) Inventors: Changseok Lee, Siheung-si (KR); Keunwook Shin, Yongin-si (KR); Hyeonjin Shin, Suwon-si (KR); Seongjun Park, Seoul (KR); Hyunjae Song, Hwaseong-si (KR); Hyangsook Lee, Hwaseong-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/052,290

(22) Filed: Feb. 24, 2016

(65) Prior Publication Data

US 2016/0351491 A1 Dec. 1, 2016

(30) Foreign Application Priority Data

Jun. 1, 2015 (KR) .................. 10-2015-0077490

(51) Int. Cl.
*H01L 23/528* (2006.01)
*H01L 27/06* (2006.01)

(52) U.S. Cl.
CPC ............... *H01L 27/0629* (2013.01)

(58) Field of Classification Search
CPC ........... H01L 23/53238; H01L 21/7685; H01L 23/53223; H01L 23/53252;

(Continued)

(56) References Cited

U.S. PATENT DOCUMENTS 5,943,601 A * 8/1999 Usui .................. H01L 21/2855
257/E21.169
9,337,149 B2 5/2016 Im et al.
(Continued)

FOREIGN PATENT DOCUMENTS

JP 1995-0238000 A 9/1995
JP 3361971 B2 1/2003
(Continued)

OTHER PUBLICATIONS

Lili Yu et al., "Graphene/MoS2 Hybrid Technology for Large-Scale Two-Dimensional Electronics", Nano Letters. American Chemical Society. pp. 3055-3063 (2014).

(Continued)

*Primary Examiner* — Roy Potter
(74) *Attorney, Agent, or Firm* — Harness, Dickey & Pierce P.L.C.

(57) ABSTRACT

A wiring structure may include at least two conductive material layers and a two-dimensional layered material layer in an interface between the at least two conductive material layers. The two-dimensional layered material layer may include a grain expander layer which causes grain size of a conductive material layer which is on the two-dimensional layered material layer to be increased. Increased grain size may result in resistance of the second conductive material layer to be reduced. As a result, the total resistance of the wiring structure may be reduced. The two-dimensional layered material layer may contribute to reducing a total thickness of the wiring structure. Thus, a low-resistance and high-performance wiring structure without an increase in a thickness thereof may be implemented.

20 Claims, 7 Drawing Sheets

(58) Field of Classification Search
CPC ......... H01L 23/53233; H01L 21/32051; H01L 21/76832
See application file for complete search history.

(56) References Cited

U.S. PATENT DOCUMENTS

| | | |
|---|---|---|
| 2015/0087060 A1 | 3/2015 | Osafune et al. |
| 2015/0235959 A1 | 8/2015 | Lee et al. |
| 2015/0364589 A1 | 12/2015 | Lee et al. |

FOREIGN PATENT DOCUMENTS

| | | | |
|---|---|---|---|
| KR | 2002-0046467 | A | 6/2002 |
| KR | 10-0546724 | B1 | 1/2006 |
| KR | 20150098180 | A | 8/2015 |
| KR | 2016-0015126 | A | 2/2016 |

OTHER PUBLICATIONS

Lili Yu et al. "Graphene-MoS$_2$ Hybrid Technology for Large-Scale Two-Dimensional Electronics". Supporting Information. (2014). p. 1-11.

\* cited by examiner

# WIRING STRUCTURE AND ELECTRONIC DEVICE INCLUDING THE SAME

CROSS-REFERENCE TO RELATED APPLICATION

This application claims the benefit of Korean Patent Application No. 10-2015-0077490, filed on Jun. 1, 2015, in the Korean Intellectual Property Office, the disclosure of which is incorporated herein in its entirety by reference.

BACKGROUND

1. Field

The present disclosure relates to wiring structures and electronic devices employing the wiring structures.

2. Description of the Related Art

In some cases, reduction in a line width or a thickness of metal wiring of high-density high-performance semiconductor devices may result in an increase in the quantity of semiconductor chips to be integrated per wafer, thereby augmenting semiconductor chip operations. In addition, a small thickness of metal wiring may reduce line capacitance, resulting in an increase in a speed of signals passing through the wiring and thereby further improving semiconductor device performance.

In some cases, wiring electrical resistance (referred to herein as simply "resistance") may increase as the line width or the thickness of the metal wiring is reduced. As a result, reduction of the resistance in a wiring structure may enable further improvement in semiconductor device operations. In some cases, interconnect technology is approaching a physical limit where specific resistance increases as the line width and thickness of the metal wiring are reduced, to the point where the increased resistance frustrates semiconductor device operations where line width and metal wiring thickness are reduced below a threshold limit.

SUMMARY

Provided are wiring structures and electronic devices including the wiring structures having reduced wiring resistance.

Additional aspects will be set forth in part in the description which follows and, in part, will be apparent from the description, or may be learned by practice of the presented example embodiments.

In some example embodiments, a wiring structure includes: a first conductive material layer; a two-dimensional layered material layer on the first conductive material layer; and a second conductive material layer on the two-dimensional layered material layer.

The two-dimensional layered material layer may include one or more atom layers.

The two-dimensional layered material layer may include a grain expansion layer, wherein a grain size of the second conductive material layer is expanded by the grain expansion layer.

The two-dimensional layered material layer may include a transition metal dichalcogenides (TMDCs)-based material or hexagonal boron nitride (h-BN).

The two-dimensional layered material layer may include one of MoS2, MoSe2, WS2, WSe2, and h-BN.

The two-dimensional layered material layer may be transferred onto the first conductive material layer or directly grown on the first conductive material layer.

The first conductive material layer may include a metal layer, the two-dimensional layered material layer may be formed on the metal layer, and the second conductive material layer may be formed of a metal material.

The metal layer may include at least one of TiN or TiSiN, and the second conductive material layer may include at least one of W, Al, or Cu.

The first conductive material layer may further include a polysilicon layer, and the metal layer may block diffusion of a doping element from the polysilicon layer.

The metal layer may be formed of a material including at least one of: a transition metal including Ni, Cu, Co, Fe, or Ru, and at least one of TiN, W, NiSi, CoSi, CuSi, FeSi, MnSi, RuSi, RhSi, IrSi, PtSi, TiSi, TiSiN, WSi, or an alloy thereof.

In some example embodiments, a wiring structure includes: a first conductive material layer; a grain expansion layer formed on the first conductive material layer, wherein the grain expansion layer is formed of a two-dimensional layered material of one or more atom layers; and a second conductive material layer formed on the grain expansion layer, wherein a grain size of the second conductive material layer is expanded by the grain expansion layer.

The grain expansion layer may include at least one of a transition metal dichalcogenides (TMDCs)-based material or hexagonal boron nitride (h-BN).

The grain expansion layer may include at least one of MoS2, MoSe2, WS2, WSe2, or h-BN.

The grain expansion layer may be transferred onto the first conductive material layer or directly grown on the first conductive material layer.

The first conductive material layer may include a metal layer, the grain expansion layer is formed on the metal layer, and the second conductive material layer may include a metal material.

The metal layer may include at least one of TiN or TiSiN, and the second conductive material layer may include at least one of W, Al, or Cu.

The metal layer may be formed of a material including at least one of a transition metal including Ni, Cu, Co, Fe, or Ru, and at least one of TiN, W, NiSi, CoSi, CuSi, FeSi, MnSi, RuSi, RhSi, IrSi, PtSi, TiSi, TiSiN, WSi, or an alloy thereof.

The first conductive material layer may further include a polysilicon layer, and the metal layer may block diffusion of a doping element from the polysilicon layer.

In some example embodiments, an electronic device includes a wiring structure, the wiring structure including a first conductive material layer, a two-dimensional layered material layer formed on the first conductive material layer, and a second conductive material layer formed on the two-dimensional layered material layer described above.

The electronic device may include a plurality of elements including at least one of a transistor, a capacitor, and a resistor, wherein the wiring structure is configured to be used in at least one of a connection between the plurality of elements, a connection within each of the elements, a connection between at least two unit cells formed of a combination of the elements, or an interconnection between at least two chips that are manufactured by combining the at least two unit cells.

BRIEF DESCRIPTION OF THE DRAWINGS

These and/or other aspects will become apparent and more readily appreciated from the following description of the exemplary embodiments, taken in conjunction with the accompanying drawings in which.

Figure 1:
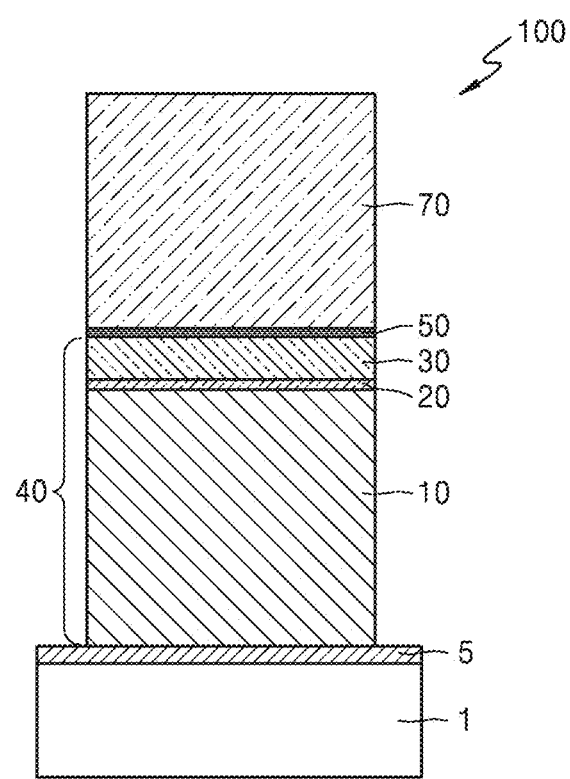
FIG. 1 is a schematic cross-sectional view illustrating a wiring structure according to some example embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

FIG. 1 is a schematic cross-sectional view illustrating a wiring structure 100 according to some example embodiments.

Referring to FIG. 1, the wiring structure 100 according to some example embodiments includes a first conductive material layer 40, a two-dimensional layered material layer 50, and a second conductive material layer 70 on a substrate 1.

The substrate 1 may include a substrate for manufacturing devices, chips, or apparatuses to which the wiring structure 100 according to some example embodiments may be applied, and may include, for example, a silicon substrate. For example, a silicon substrate may be used as the substrate 1, and a semiconductor device, a semiconductor chip, or a semiconductor apparatus to which the wiring structure 100 according to some example embodiments may be applied may be manufactured on the substrate 1. Other types of substrate may be used as the substrate 1. An insulation layer 5, which may include a silicon oxide layer, may be formed on the substrate 1.

The first conductive material layer 40 may be a single layer or may include multiple layers. The first conductive material layer 40 may include a metal layer 30. The first conductive material layer 40 may further include a semiconductor material layer, which may include a polysilicon layer 10. FIG. 1 illustrates an example where the first conductive material layer 40 includes the metal layer 30 and the polysilicon layer 10. Hereinafter, the description will focus on some example embodiments in which the polysilicon layer 10 is included as a semiconductor material layer for clarity of description. However, the semiconductor material layer used as the first conductive material layer 40 may also include other types of semiconductor material, in addition or alternative to polysilicon.

The metal layer 30 may be formed of, for example, a material including TiN or TiSiN. In addition, the metal layer 30 may be formed of, for example, a material including at least one of a transition metal and TiN, W, NiSi, CoSi, CuSi, FeSi, MnSi, RuSi, RhSi, IrSi, PtSi, TiSi, TiSiN, WSi, or an alloy thereof. A transition metal may include at least one of Ni, Cu, Co, Fe, or Ru.

In some example embodiments, when the first conductive material layer 40 includes the polysilicon layer 10 and the metal layer 30, the metal layer 30 may function as a barrier that blocks diffusion of a doping element from the polysilicon layer 10.

In some example embodiments, when the first conductive material layer 40 includes the polysilicon layer 10 and the metal layer 30, an intermediate layer 20 may be further formed in an interface between the polysilicon layer 10 and the metal layer 30.

When the metal layer 30 is formed of, for example, TiSiN or TiSiN (TSN), the intermediate layer 20 may be formed of, for example, a WSix layer to provide an ohmic contact in the interface between the polysilicon layer 10 and the metal layer 30. In some example embodiments, the intermediate layer 20 is not formed as a layer but as particles on the polysilicon layer 10. The intermediate layer 20 is illustrated as a layer in FIG. 1 for convenience of illustration. In some example embodiments, the intermediate layer 20 may be formed as a layer.

Meanwhile, FIG. 1 illustrates that the first conductive material layer 40 is formed of multiple layers including the metal layer 30 and the polysilicon layer 10, which, however, is exemplary. The exemplary embodiments are not limited thereto, and the first conductive material layer 40 may include multiple layers of various compositions. Also, the first conductive material layer 40 in the wiring structure 100 according to some example embodiments may include a single layer.

In some example embodiments, the two-dimensional layered material layer 50 is formed on the first conductive material layer 40. For example, the two-dimensional layered material layer 50 may be formed on the metal layer 30.

The two-dimensional layered material layer 50 may be formed of one or more atom layers. For example, the two-dimensional layered material layer 50 may be formed of one or two atom layers.

The two-dimensional layered material layer 50 may be formed of a semiconductor-type two-dimensional layered material such as $MoS_2$ or an insulating two-dimensional layered material such as h-BN. In addition, the two-dimensional layered material layer 50 may be formed of other transition metal dichalcogenides (TMDCs)-based two-dimensional layered materials, for example, one of $MoSe_2$, $WS_2$, and $WSe_2$. Examples of the TMDCs-based two-dimensional layered material may include $MoS_2$, $MoSe_2$, $WS_2$, and $WSe_2$.

The two-dimensional layered material layer 50 may be transferred onto the first conductive material layer 40 or directly grown on the first conductive material layer 40.

The second conductive material layer 70 may be formed of a metal material which may include tungsten (W). The second conductive material layer 70 may also be formed of one or more other types of metal material. For example, the second conductive material layer 70 may be formed of a metal including aluminum (Al) or copper (Cu).

In some example embodiments, the two-dimensional layered material layer 50 functions as a grain expansion layer with respect to the second conductive material layer 70. For example, as a result of forming the two-dimensional layered material layer 50 from one or more atom layers formed of a two-dimensional layered material (i.e., as a result of forming a grain expansion layer), and forming the second conductive material layer 70 on the two-dimensional layered material layer 50, a grain size of the second conductive material layer 70 may be expanded due to the two-dimensional layered material layer 50 (i.e., the grain expansion layer).

As described above, in some example embodiments when the two-dimensional layered material layer 50 is formed and then the second conductive material layer 70 is formed on the two-dimensional layered material layer 50, as the two-dimensional layered material layer 50 is formed of one or more atom layers, a total stack thickness of the wiring structure 100 may be significantly reduced. In addition, as a grain size of the second conductive material layer 70 is greatly increased, resistance of the second conductive material layer 70 may be greatly reduced, thereby greatly reducing the total resistance of the wiring structure 100. Thus, a low-resistance wiring may be implemented using the wiring structure 100 having a conductive material/two-dimensional layered material/conductive material structure.

A wiring structure used in a dynamic random access memory (DRAM) may include a stack structure including, for example, a Poly-Si/TiN (or TSN)/W stack structure, and a WSix layer may be formed in an interface between a poly-Si layer and a TiN (or TSN) layer or an interface between a TiN (or TSN) layer and a W layer. In some example embodiments, the stack structure of FIG. 1 may be applied to the wiring structure of the DRAM as described above. For example, in the wiring structure of the DRAM, instead of forming a WSix layer in the interface between the TiN layer and the W layer, the two-dimensional layered material layer 50 may be formed. In some example embodiments, the two-dimensional layered material layer 50 may function as a grain expansion layer with respect to the W layer.

Figure 2:
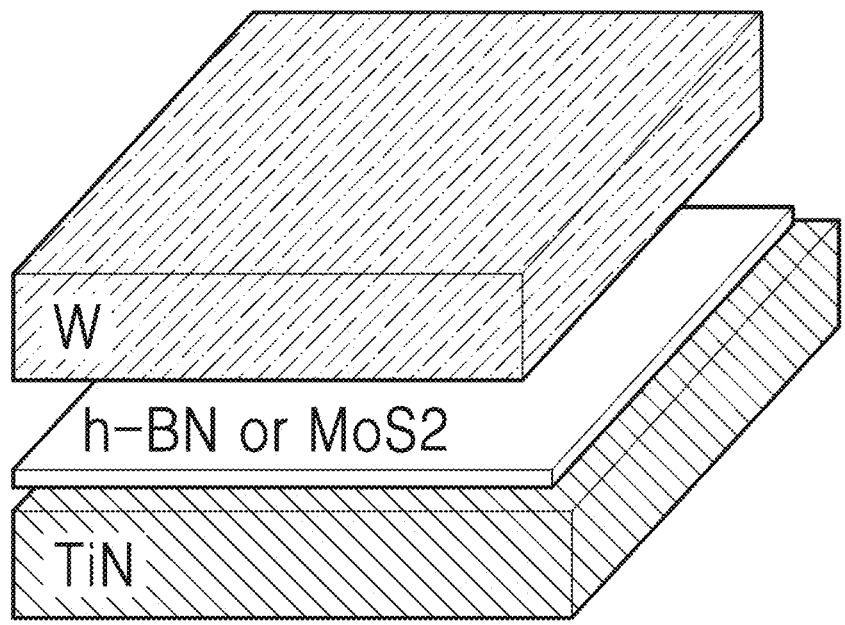
FIG. 2 is a diagram of a stack structure in which a two-dimensional layered material layer including a hexagonal boron nitride (h-BN) or $MoS_2$ is inserted into a tungsten (W)/titanium nitride (TiN) interface according to some example embodiments.
Figure 3:
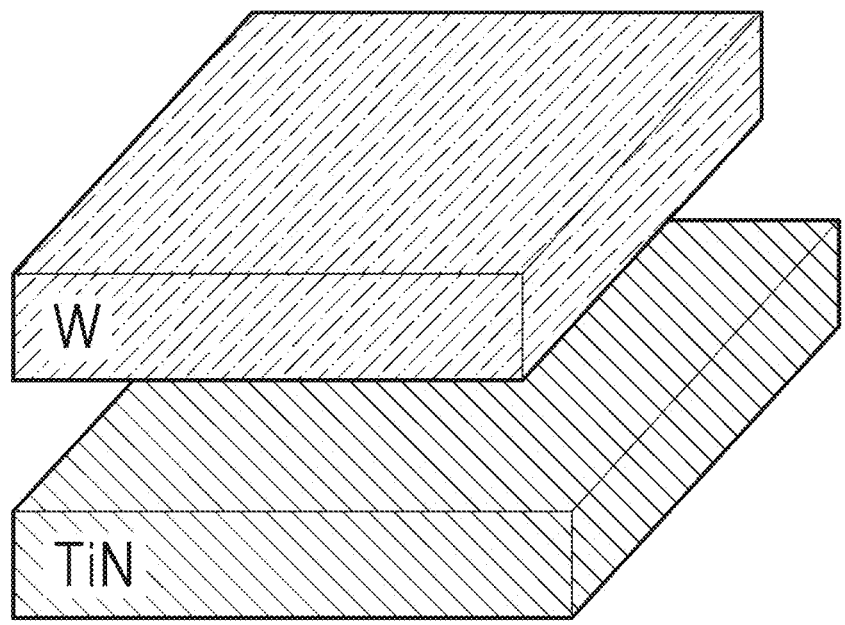
FIG. 3 is a diagram of a W/TiN stack structure as a comparative example.

FIG. 2 is a diagram of a stack structure in which a two-dimensional layered material layer including a hexagonal boron nitride (h-BN) or $MoS_2$ is inserted into a W/TiN interface according to some example embodiments. FIG. 3 is a diagram of a W/TiN stack structure as a comparative example. A W/TiN structure may include a wiring structure used in a DRAM front end of line (FEOL). While spaces are illustrated between layers in FIGS. 2 and 3, the one or more spaces may not exist between layers in a real stack structure.

Figure 4:
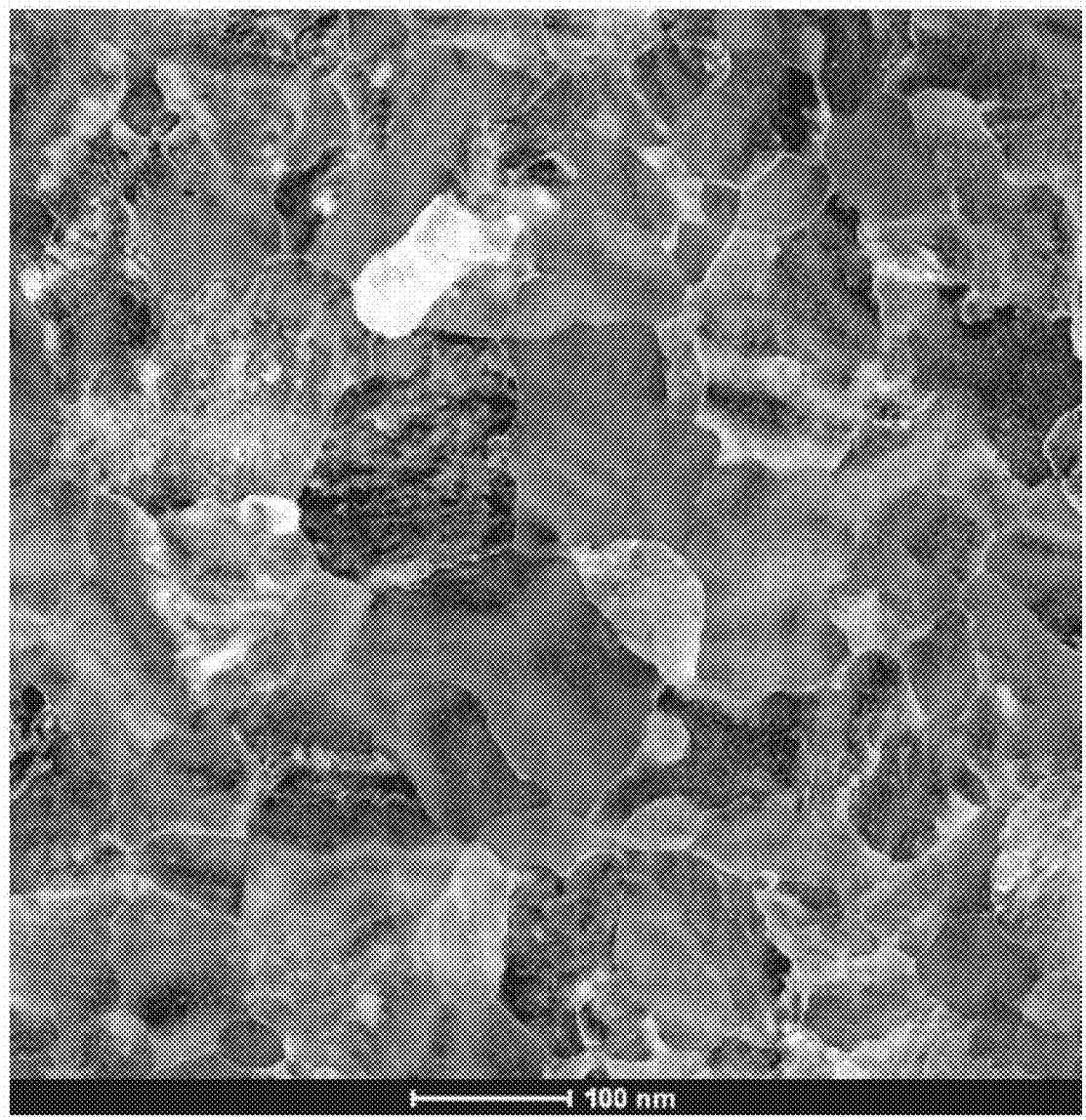
FIG. 4 illustrates a grain size of a W layer when a two-dimensional layered material layer including h-BN is formed on a TiN layer and the W layer is formed on the two-dimensional layered material layer according to some example embodiments.
Figure 5:
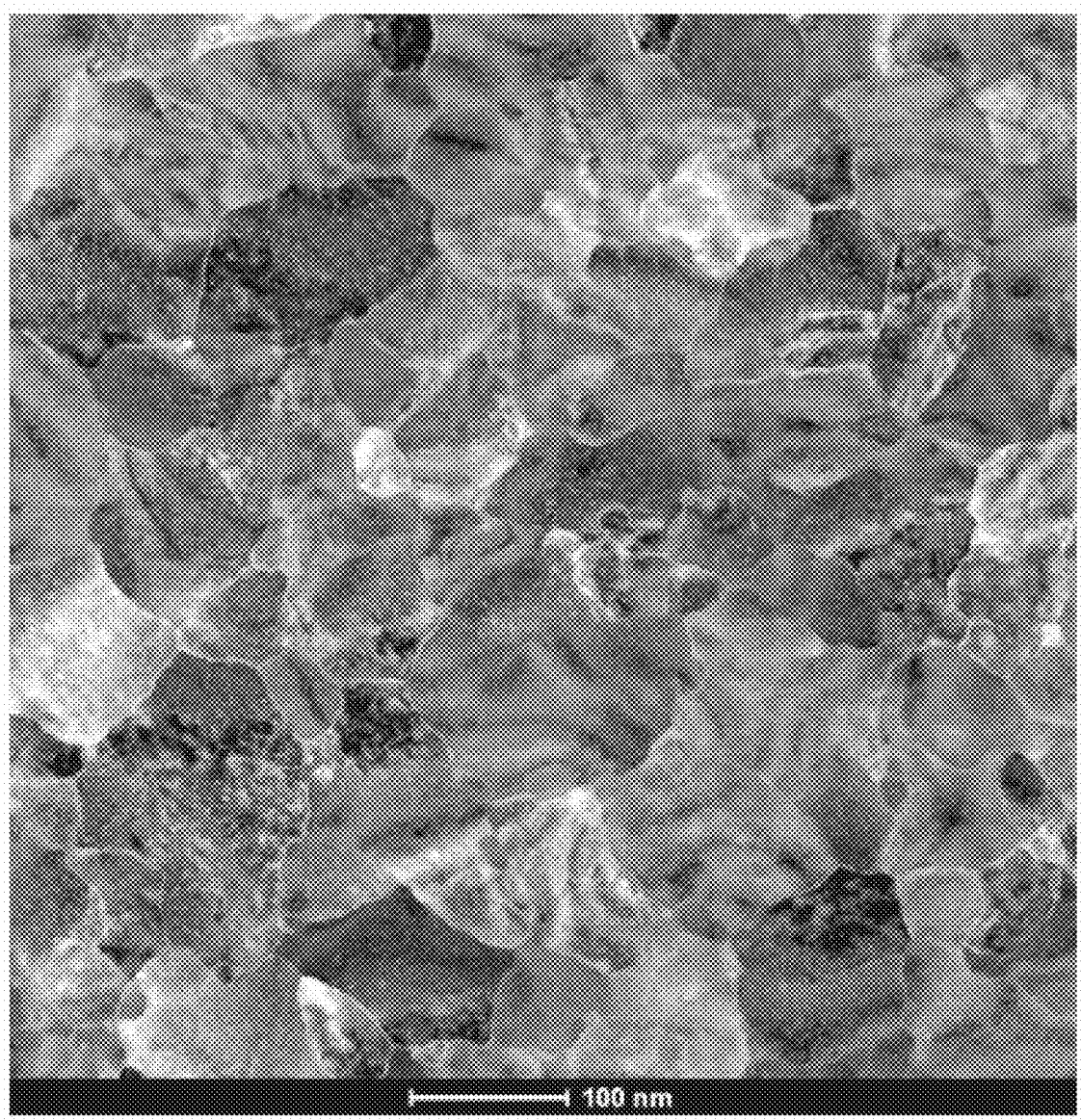
FIG. 5 illustrates a grain size of a W layer when a two-dimensional layered material layer including $MoS_2$ is formed on a TiN layer and the W layer is formed on the two-dimensional layered material layer according to some example embodiments.
Figure 6:
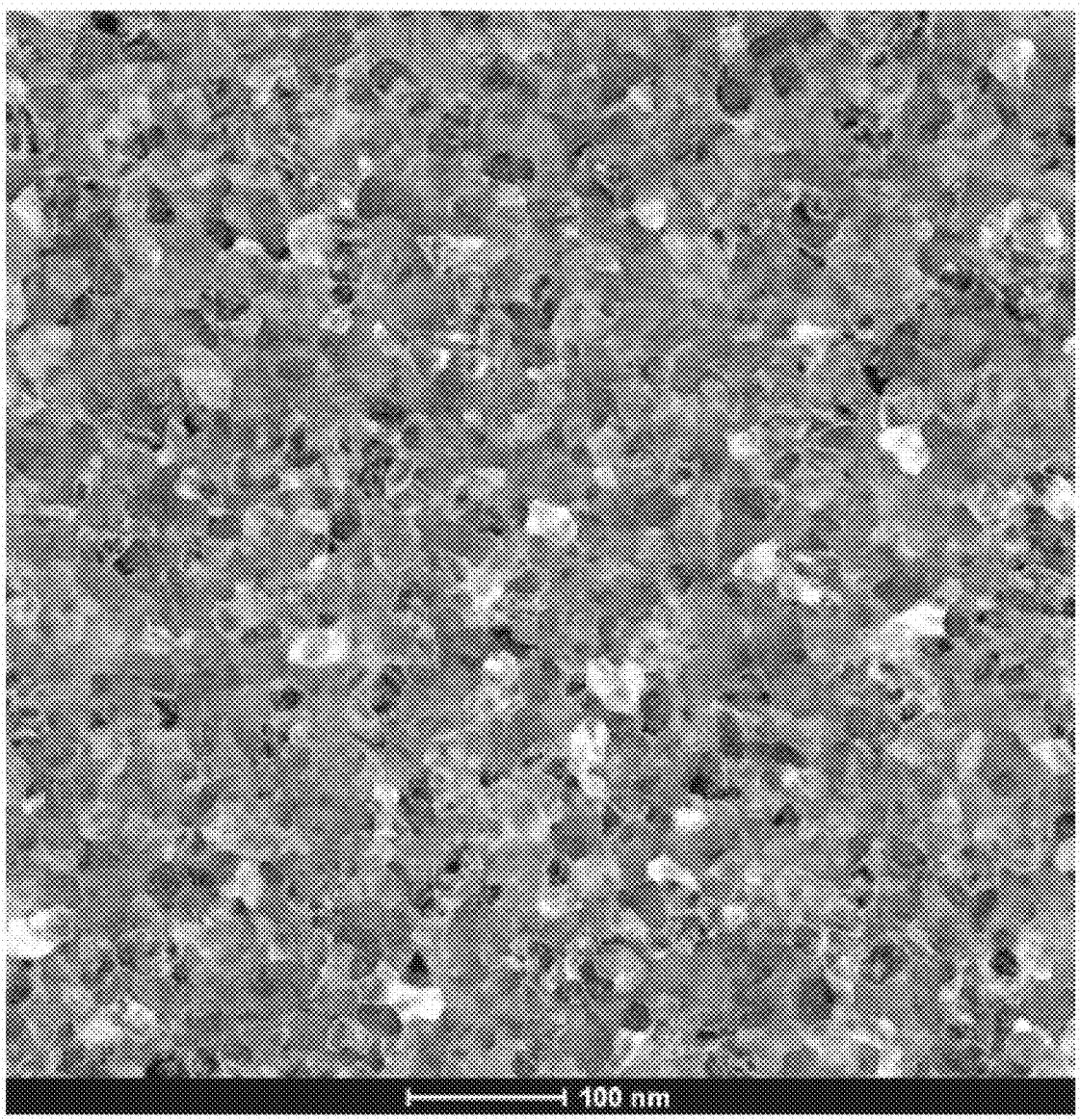
FIG. 6 illustrates a grain size of a W layer when the W layer is formed on a TiN layer, as a comparative example.

FIGS. 4 and 5 show a grain size of a W layer when a two-dimensional layered material layer 50 including h-BN or $MoS_2$ is formed on a TiN layer according to some example embodiments, and a W layer is formed on the two-dimensional layered material layer 50 according to some example embodiments. FIG. 4 shows that h-BN is used as the two-dimensional layered material layer 50, and FIG. 5 shows that $MoS_2$ is used as the two-dimensional layered material layer 50. FIG. 6 shows a grain size of a W layer when the W layer is formed on a TiN layer, as a comparative example. Photographic images of FIGS. 4 through 6 are at the same scale.

As may be seen from comparison between FIGS. 4 and 5, and 6, when the two-dimensional layered material layer 50 is inserted between the TiN layer and the W layer, a gain size of the W layer may be greatly increased compared to when the two-dimensional layered material layer 50 is not inserted. When the grain size of the W layer increases, resistance may be reduced significantly.

Figure 7:
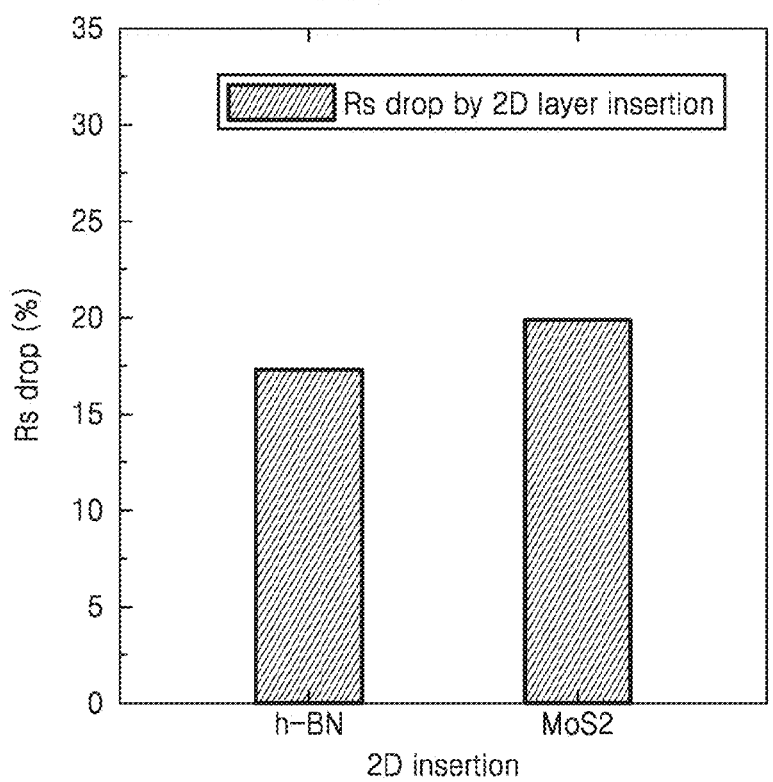
FIG. 7 is a bar graph showing a reduction amount of sheet resistance Rs when h-BN and $MoS_2$ are each used in a two-dimensional layered material layer according to some example embodiments.

FIG. 7 is a bar graph showing a reduction amount of sheet resistance Rs when h-BN and $MoS_2$ are each used in a two-dimensional layered material layer according to some example embodiments. FIG. 7 is a graph showing sheet resistance of respective stack structures, where sheet resistance was dropped by about 17.4% in a W/h-BN/TiN structure with respect to W/TiN sample, and sheet resistance dropped by about 19.9% in a W/$MoS_2$/TiN structure with respect to W/TiN sample according to some example embodiments.

Referring to FIGS. 4 and 7, when the two-dimensional layered material layer 50 formed on the TiN layer is formed of h-BN, and a W layer is formed thereon, a grain size of the W layer is expanded compared to a structure in which a W layer is formed on a TiN layer. Thus, sheet resistance dropped by about 17.4%.

Referring to FIGS. 5 and 7, when the two-dimensional layered material layer 50 formed on the TiN layer is formed of $MoS_2$, and a W layer is formed thereon, a grain size of the W layer is expanded compared to a structure in which a W layer is formed on a TiN layer, and thus, sheet resistance dropped by about 19.9%.

Figure 8:
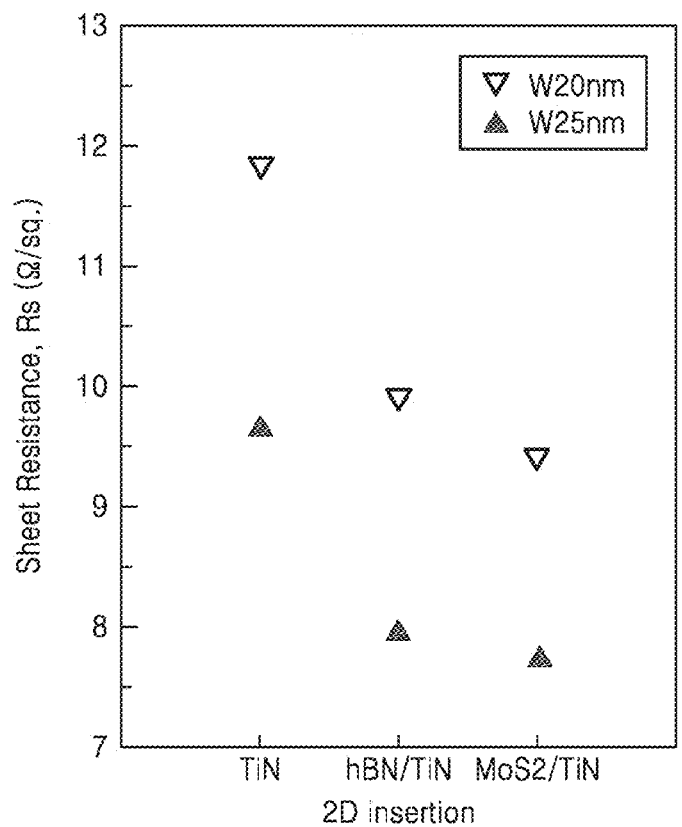
FIG. 8 is a graph showing sheet resistance according to variation in a line width of a wiring structure of respective stack structures, where sheet resistances according to a line width of a wiring structure when a TiN layer, a h-BN/TiN layer, and a $MoS_2$/TiN layer are respectively formed below a W layer according to some example embodiments.

FIG. 8 is a graph showing sheet resistance according to variation in a line width of a wiring structure of respective stack structures, where sheet resistances according to a line width of a wiring structure is shown when a TiN layer, a h-BN/TiN layer, and a $MoS_2$/TiN layer are respectively formed below a W layer according to some example embodiments. In FIG. 8, sheet resistances of a wiring structure having a line width of 20 nm (W20 nm) and a wiring structure having a line width of 25 mm (W25 nm) are shown.

Referring to FIG. 8, when the line width of the wiring structure is reduced, sheet resistance Rs increases. Even when the line width of the wiring structure is reduced, when the two-dimensional layered material layer 50 formed of h-BN or $MoS_2$ is used, sheet resistance may be reduced. For example, when the two-dimensional layered material layer 50 formed of h-BN or $MoS_2$ is used, even when the line width of a wiring structure is reduced from 25 nm to 20 nm, sheet resistance similar to that when the line width is 25 nm, and the two-dimensional layered material layer 50 formed of h-BN or $MoS_2$ is not used, may be obtained.

As may be seen from FIG. 8, when the two-dimensional layered material layer 50 formed of h-BN or $MoS_2$ is inserted into the interface between the TiN layer and the W layer, a low-resistance wiring structure may be implemented even when the line width is reduced. In addition, when a line width of a wiring structure is 20 nm or 25 nm, and the two-dimensional layered material layer 50 formed of h-BN or $MoS_2$ is inserted into the interface between the TiN layer and the W layer, sheet resistance may be significantly reduced compared when the two-dimensional layered material layer 50 is not inserted.

As described above, in a multi-stack structure of the wiring structure 100, by inserting the two-dimensional layered material layer 50 into an interface between the first conductive material layer 40 and the second conductive material layer 70, total resistance of the wiring structure 100 may be significantly reduced, and accordingly, the line width of the wiring structure may also be reduced.

In addition, as the two-dimensional layered material layer 50 is formed of one or more atom layers, for example, one or two atom layers, the two-dimensional layered material layer 50 may contribute to reducing a total thickness of the multi-stack structure of the wiring structure 100 as the two-dimensional layered material layer 50 has a relatively small thickness. Thus, a low-resistance and high-performance wiring structure without an increase in a thickness thereof may be implemented.

For example, in the case of a W/TiN stack used in semiconductor FEOL area, a WSix layer having a thickness of several nm is inserted, and according to the wiring structure 100 according to some example embodiments, resistance may be significantly reduced without an increase in a thickness thereof by inserting the two-dimensional layered material layer 50 including one or more atom layers, and thus, a high-performance wiring structure may be implemented.

Accordingly, according to the wiring structure 100 according to some example embodiments, the resistance or the total stack thickness may be reduced to a level which satisfies next-generation or next-next-generation DRAM requirements, and thus, a high-performance next-generation memory may be implemented.

The wiring structure 100 according to some example embodiments may be applied to an electronic device. The electronic device includes multiple elements, which may include at least one of each of a transistor, a capacitor, and a resistor. The wiring structure 100 according to the exemplary embodiment may be used in at least one of a connection between multiple elements, a connection in each element of the multiple elements, a connection between at least two unit cells formed of a combination of multiple elements, or a mutual connection between at least two chips that are manufactured by combining at least two unit cells.

Figure 9:
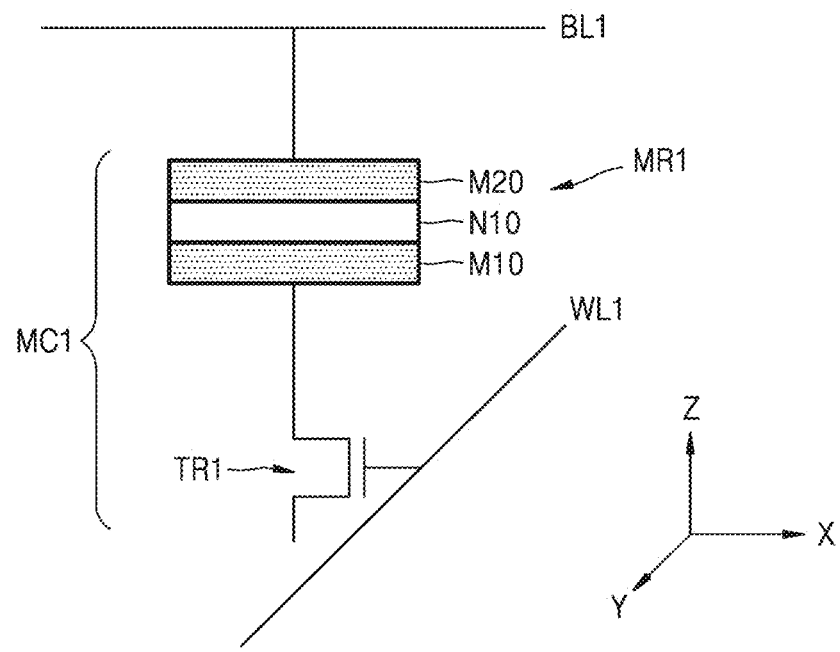
FIG. 9 schematically illustrates a memory device as an example of an electronic device according to some example embodiments.

FIG. 9 schematically illustrates a memory device as an example of an electronic device according to some example embodiments.

Referring to FIG. 9, the memory device according to some example embodiments may include a magnetic resistance element MR1 and a switching element TR1 in a memory cell MC1, and the memory cell MC1 may be connected between a bit line BL1 and a word line WL1.

The wiring structure 100 according to some example embodiments may be applied to at least one of the bit line BL1 and the word line WL1, for example, to the bit line BL1.

The bit line BL1 and the word line WL1 may be arranged to cross each other, and the memory cell MC1 may be disposed at a point of intersection therebetween. The bit line BL1 may be connected to the magnetic resistance element MR1. The bit line BL1 may be electrically connected to a second magnetic material layer M20 of the magnetic resistance element MR1. The word line WL1 may be connected to the switching element TR1. When the switching element TR1 is a transistor, the word line WL1 may be connected to a gate electrode of the switching element TR1. A write current, a read current or an erase current or the like may be applied to the memory cell MC1 via the word line WL1 and the bit line BL1.

The magnetic resistance element MR1 may include first and second magnetic material layers M10 and M20 and a non-magnetic layer N10 therebetween. One of the first and second magnetic material layers M10 and M20 may include a free layer and another layer may include a fixed layer. For example, the first magnetic material layer M10 may be a free layer, and the second magnetic material layer M20 may be a fixed layer.

The switching element TR1 may be, for example, a transistor. The switching element TR1 may be electrically connected to the first magnetic material layer M10 of the magnetic resistance element MR1.

While one memory cell MC1 is illustrated in FIG. 9, a plurality of memory cells MC1 may be arranged in an array, in some example embodiments. As a result, a plurality of bit lines BL1 and a plurality of word lines WL1 may be arranged to cross each other, and memory cells MC1 may be disposed at respective points of intersection therebetween.

Figure 10:
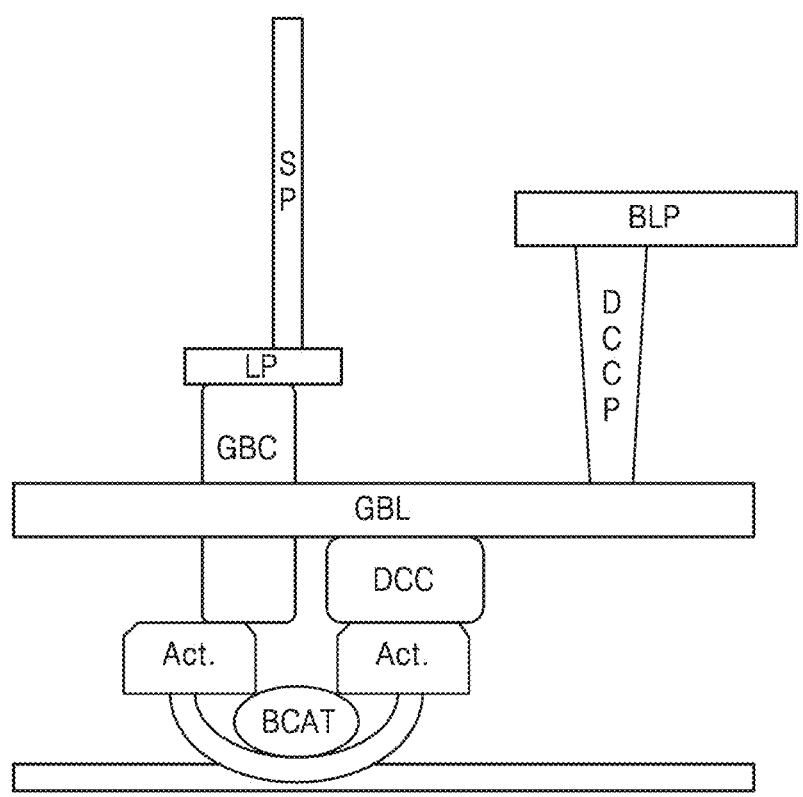
FIG. 10 schematically illustrates a dynamic random access memory (DRAM) as another example of an electronic device according to some example embodiments.

FIG. 10 schematically illustrates a DRAM as another example of an electronic device according to some example embodiments.

Referring to FIG. 10, a signal which is input via a gate bit line (GBL) may be transmitted to an active layer (Act) below the gate bit line GBL via a duty cycle corrector (DCC). The signal may be transmitted from the active layer Act to another active layer Act via a transistor operation of a buried channel array transistor (BCAT). The signal may be stored as information in a capacitor SP via a gate body serial contact GBC.

In the DRAM as described above, the wiring structure 100 according to some example embodiments may be applied, for example, to the gate bit line GBL.

The electronic device to which the wiring structure 100 according to some example embodiments may be applied is described as an example. Example embodiments are not limited thereto, and the wiring structure 100 according to some example embodiments may be applied to various electronic devices in which elements are interconnected.

According to the wiring structure of some example embodiments, total resistance of the wiring structure may be significantly reduced based on inserting a two-dimensional layered material layer in an interface between two conductive material layers, and accordingly, a thickness or line width of the wiring structure may also be reduced.

In addition, as the two-dimensional layered material layer is formed of one or more atom layers, low-resistance wiring may be formed without increasing a thickness of the wiring structure.

It should be understood that example embodiments described herein should be considered in a descriptive sense only and not for purposes of limitation. Descriptions of features or aspects within some example embodiments should typically be considered as available for other similar features or aspects in some example embodiments.

While some example embodiments have been described with reference to the figures, it will be understood by those of ordinary skill in the art that various changes in form and details may be made therein without departing from the spirit and scope as defined by the following claims.

What is claimed is:

1. A wiring structure comprising:
a first conductive material layer, the first conductive material layer including a metal layer;
a two-dimensional layered material layer on the metal layer; and
a second conductive material layer on the two-dimensional layered material layer, the second conductive material layer including a metal material.

2. The wiring structure of claim 1, wherein the two-dimensional layered material layer includes one or more atom layers.

3. The wiring structure of claim 1, wherein the two-dimensional layered material layer includes a grain expansion layer,
wherein a grain size of the second conductive material layer is expanded by the grain expansion layer.

4. The wiring structure of claim 1, wherein the two-dimensional layered material layer includes a transition metal dichalcogenides (TMDCs)-based material or hexagonal boron nitride (h-BN).

5. The wiring structure of claim 1, wherein the two-dimensional layered material layer includes at least one of $MoS_2$, $MoSe_2$, $WS_2$, $WSe_2$, or h-BN.

6. The wiring structure of claim 1, wherein the two-dimensional layered material layer is transferred onto the first conductive material layer or directly grown on the first conductive material layer.

7. The wiring structure of claim 1, wherein the metal layer includes at least one of TiN or TiSiN, and the second conductive material layer includes at least one of W, Al, or Cu.

8. The wiring structure of claim 1, wherein the first conductive material layer further includes a polysilicon layer, and
the metal layer blocks diffusion of a doping element from the polysilicon layer.

9. The wiring structure of claim 1, wherein the metal layer includes a material including at least one of,
a transition metal including at least one of Ni, Cu, Co, Fe, or Ru, and
at least one of TiN, W, NiSi, CoSi, CuSi, FeSi, MnSi, RuSi, RhSi, IrSi, PtSi, TiSi, TiSiN, WSi, or an alloy thereof.

10. A wiring structure comprising:
a first conductive material layer;
a grain expansion layer on the first conductive material layer, wherein the grain expansion layer includes a two-dimensional layered material of one or more atom layers; and a second conductive material layer on the grain expansion layer, wherein a grain size of the second conductive material layer is expanded by the grain expansion layer.

11. The wiring structure of claim 10, wherein the grain expansion layer includes at least one of a transition metal dichalcogenides (TMDCs)-based material or hexagonal boron nitride (h-BN).

12. The wiring structure of claim 10, wherein the grain expansion layer includes at least one of $MoS_2$, $MoSe_2$, $WS_2$, $WSe_2$, or h-BN.

13. The wiring structure of claim 10, wherein the grain expansion layer is transferred onto the first conductive material layer or directly grown on the first conductive material layer.

14. The wiring structure of claim 10, wherein
the first conductive material layer includes a metal layer,
the grain expansion layer on the metal layer, and
the second conductive material layer includes a metal material.

15. The wiring structure of claim 14, wherein
the metal layer includes at least one of TiN or TiSiN, and
the second conductive material layer includes at least one of W, Al, or Cu.

16. The wiring structure of claim 14, wherein the metal layer includes a material including at least one of,
a transition metal including at least one of Ni, Cu, Co, Fe, or Ru, and
at least one of TiN, W, NiSi, CoSi, CuSi, FeSi, MnSi, RuSi, RhSi, IrSi, PtSi, TiSi, TiSiN, WSi, or an alloy thereof.

17. The wiring structure of claim 14, wherein the first conductive material layer further includes a polysilicon layer, and
the metal layer is configured to block diffusion of a doping element from the polysilicon layer.

18. An electronic device comprising the wiring structure of claim 1.

19. The electronic device of claim 18, further comprising:
a plurality of elements including al least one of,
a transistor,
a capacitor, and
a resistor,
wherein the wiring structure is configured to be used in at least one of,
a connection between the plurality of elements,
at least one connection within each element of the plurality of elements,
a connection between at least two unit cells, the at least two unit cells formed of a combination of at least two elements of the plurality of elements, or
an interconnection between at least two chips, the at least two chips being are manufactured by combining at least two unit cells.

20. A wiring structure, comprising:
a first conductive material layer;
a two-dimensional layered material layer on the first conductive material layer; and
a second conductive material layer on the two-dimensional layered material layer;
wherein the two-dimensional layered material layer includes at least one of, a transition metal dichalcogenides (TMDCs)-based material, and hexagonal boron nitride (h-BN).

* * * * *